United States Patent
Nakano et al.

(10) Patent No.: US 7,346,712 B2
(45) Date of Patent: Mar. 18, 2008

(54) SEMICONDUCTOR INTEGRATED CIRCUIT APPARATUS AND CIRCUIT BOARD AND INFORMATION READOUT METHOD

(75) Inventors: Takahito Nakano, Tokyo (JP); Hiroyuki Kiba, Tokyo (JP); Satoshi Akui, Kanagawa (JP)

(73) Assignee: Sony Corporation, Tokyo (JP)

( * ) Notice: Subject to any disclaimer, the term of this patent is extended or adjusted under 35 U.S.C. 154(b) by 268 days.

(21) Appl. No.: 10/735,680

(22) Filed: Dec. 16, 2003

(65) Prior Publication Data
US 2004/0174753 A1    Sep. 9, 2004

(30) Foreign Application Priority Data
Dec. 25, 2002    (JP)    ............................. P2002-373687

(51) Int. Cl.
*G06F 3/00*    (2006.01)
*G06F 9/00*    (2006.01)
*G06F 9/44*    (2006.01)
*G11C 7/00*    (2006.01)

(52) U.S. Cl. ................. 710/5; 710/1; 710/16; 712/227; 365/200

(58) Field of Classification Search ...................... None
See application file for complete search history.

(56) References Cited

U.S. PATENT DOCUMENTS 5,642,307 A *  6/1997  Jernigan ..................... 365/103
5,794,066 A *  8/1998  Dreyer et al. ................. 712/32
5,856,923 A *  1/1999  Jones et al. .................. 700/121
6,065,113 A *  5/2000  Shiell et al. ................. 712/227
6,889,299 B1 * 5/2005  Yamada ........................ 711/167

* cited by examiner

*Primary Examiner*—Alford Kindred
*Assistant Examiner*—Richard Franklin
(74) *Attorney, Agent, or Firm*—Oblon, Spivak, McClelland, Maier & Neustadt, P.C.

(57) ABSTRACT

A semiconductor integrated circuit apparatus capable of reading out semiconductor information stored therein is provided. A semiconductor information storage section has semiconductor information unique to a semiconductor integrated circuit apparatus stored therein. The unique semiconductor information includes, for example, an identification number for identifying the semiconductor integrated circuit apparatus and information for identifying the time of manufacture such as a lot number. An externally provided storage apparatus has a readout program stored therein for reading the semiconductor information of the semiconductor integrated circuit apparatus as required. When a signal of request for the semiconductor information is supplied from the outside, a semiconductor information output section reads out the semiconductor information from the semiconductor information storage section in response to the signal and writes the read-out semiconductor information into the external storage apparatus in accordance with the readout program in the storage apparatus if the program is executed.

7 Claims, 5 Drawing Sheets

US 7,346,712 B2

SEMICONDUCTOR INTEGRATED CIRCUIT APPARATUS AND CIRCUIT BOARD AND INFORMATION READOUT METHOD

CROSS REFERENCES TO RELATED APPLICATIONS

The present invention claims priority to its priority document No. 2002-373687 filed in the Japanese Patent Office on Dec. 25, 2002, the entire contents of which being incorporated by reference herein.

BACKGROUND OF THE INVENTION

1. Field of the Invention

The present invention relates to a semiconductor integrated circuit apparatus and a circuit board and an information readout method, and more particularly, to a semiconductor integrated circuit apparatus which is mounted on a predetermined circuit board for operation, and a circuit board on which the semiconductor integrated circuit apparatus is mounted, and an information readout method.

2. Description of Related Art

Conventionally, semiconductor integrated circuit apparatuses are subjected to tests in each step of the manufacturing process to sort out non-defective components.

For example, a burn-in test is performed on a semiconductor wafer to sort non-defective components from defective components in a plurality of chips formed on the semiconductor wafer after process steps are completed. Since a plurality of semiconductor integrated circuit apparatuses formed on the semiconductor wafer are collectively subjected to the test, a problem arises in that the states of the individual semiconductor integrated circuit apparatuses cannot be seen during the test. To address this, a semiconductor integrated circuit apparatus has been proposed in which a chip ID hold circuit is provided for holding chip IDs which allow identification of each chip, and when ID data matching a chip ID is input, a select signal for indicating the selection is provided to output an electric signal for representing electric characteristics unique to that semiconductor integrated circuit apparatus (for example, see Japanese Patent Application Laid-Open No. 11-121566, Paragraph Nos. 14 to 15, 20, and FIG. 1). This allows selection of one of the plurality of semiconductor integrated circuit apparatuses to monitor its state during the test.

A semiconductor integrated circuit apparatus selected as a non-defective component in the burn-in test performed on the wafer is cut out from the wafer. The semiconductor integrated circuit apparatus in this state is hereinafter referred to as a semiconductor chip. Subsequently, the semiconductor chip is subjected to a bonding process in which it is electrically connected to a lead frame through a bonding wire. In addition, it is sealed with a thermosetting resin or the like. The semiconductor integrated circuit apparatus in this state is referred to as a semiconductor package. The completed semiconductor package is inserted into a handler, connected to an LSI tester, and subjected to various types of tests such as a function test to sort out non-defective components. The semiconductor package is also subjected to a reliability test such as the burn-in test and then shipped and mounted on a printed circuit board of an electric device.

SUMMARY OF THE INVENTION

In the conventional semiconductor integrated circuit apparatus, however, there is a problem that it is difficult to take information held within the semiconductor integrated circuit apparatus after it is mounted on a printed circuit board as a product.

For example, when a malfunction occurs in a semiconductor integrated circuit apparatus mounted on a printed circuit board as a product, it is necessary to identify the features of the semiconductor integrated circuit apparatus (the lot number at the time of manufacture, the position on the wafer, the manufacture time) in which the malfunction occurs. However, even for a semiconductor integrated circuit apparatus holding such information for identifying the semiconductor integrated circuit apparatus as the chip ID for use in tests in the manufacture process, the information cannot be read out while the semiconductor integrated circuit apparatus is mounted on the printed circuit board. Thus, a complicated process of taking out the semiconductor chip is required to read out internal information of the semiconductor integrated circuit apparatus.

FIG. 5 shows a conventional procedure for reading out internal information of a semiconductor integrated circuit apparatus.

(Step a) A desired semiconductor package 52 is stripped from a printed circuit board 53 on which the semiconductor package 52 is mounted from which internal information stored in the apparatus is to be readout. However, the semiconductor package 52 is tightly bonded with soldering or the like, and the semiconductor package 52 has been significantly miniaturized. Thus, it is not easy to strip the desired semiconductor package 52 from the printed circuit board 53 on which a number of other semiconductor packages or parts are also mounted, and special techniques are required.

(Step b) A resin seal of the semiconductor package 52 is opened to take out a semiconductor chip 51. However, the resin seal is formed, for example, by using a molding apparatus using an epoxy-based thermosetting resin to achieve sealing with a mold at approximately 175 degrees, so that the opening thereof is not easy.

(Step c) The taken semiconductor chip 51 is measured by an LSI tester to read out internal information stored in the semiconductor chip 51.

In this manner, even when the semiconductor integrated circuit apparatus has the mechanism for holding information such as a chip ID hold circuit, the information cannot be directly read out once the semiconductor integrated circuit apparatus is mounted on the printed circuit board, thereby requiring a number of man-hours and the special techniques as described above.

The present invention has been made in view of such a problem, and there is a need to provide a semiconductor integrated circuit apparatus capable of reading out information held in the apparatus without a complicated process, and a circuit board, and an information readout method.

According to an embodiment of the present invention, there is provided a semiconductor integrated circuit apparatus mounted on a predetermined circuit board for operation including a semiconductor information storage section for storing semiconductor information unique to the semiconductor integrated circuit apparatus, and a semiconductor information output section connected to the semiconductor information storage section for reading out the semiconductor information from the semiconductor information storage section in response to a signal supplied from outside and outputting the read-out semiconductor information to the outside.

In the semiconductor integrated circuit apparatus configured as above, the semiconductor information unique to the semiconductor integrated circuit apparatus is stored in the semiconductor information storage section. The unique semiconductor information includes, for example, an identification number for identifying the semiconductor information circuit apparatus and information for specifying the time of manufacture such as a lot number. When a signal of request for the semiconductor information is supplied from the outside, the semiconductor information output section reads out the semiconductor information from the semiconductor information storage section in response to the signal and outputs the information to the outside.

According to another embodiment of the present invention, there is provided a circuit board on which a semiconductor integrated circuit apparatus is mounted includes a storage section for allowing read from and write to the outside, a semiconductor information storage section for storing semiconductor information unique to the semiconductor information circuit apparatus, and a semiconductor information output section connected to the semiconductor information storage section for reading out the semiconductor information from the semiconductor information storage section in response to a signal supplied from the outside and writing the read-out semiconductor information into the storage section.

In the circuit board configured as above, the semiconductor integrated circuit apparatus mounted on the circuit board has the unique semiconductor information stored in the semiconductor information storage section. The semiconductor information output section reads the semiconductor information in response to a signal supplied from the outside and writes the information into the storage section provided on the circuit board.

In addition, according to still another embodiment of the present invention, there is provided an information readout method of reading out semiconductor information of a semiconductor integrated circuit apparatus includes the steps of writing a program for reading out semiconductor information unique to the semiconductor integrated circuit apparatus held in the semiconductor integrated circuit apparatus into a predetermined external storage section, reading the program written into the external storage section and reading out the semiconductor information based on the program, and writing the read-out semiconductor information into a predetermined region provided in the external storage section.

In the information reading method with such a procedure, first, the program created to read out the semiconductor information held within the semiconductor integrated circuit apparatus is written into the predetermined external storage section. The semiconductor integrated circuit apparatus reads the program stored in the external storage section, reads out the internal semiconductor information in accordance with the program, and writes the read-out semiconductor information into the predetermined region provided in the external storage section.

BRIEF DESCRIPTION OF THE DRAWINGS

The above and other objects, features and advantages of the present invention will become more apparent from the following description of the presently preferred exemplary embodiment of the invention taken in conjunction with the accompanying drawing, in which.

DESCRIPTION OF THE PREFERRED EMBODIMENTS

Preferred embodiments of the present invention are hereinafter described with reference to the drawings.

First, the outline of the present invention is described, and then preferred embodiments to which the present invention is applied are described.

Figure 1:
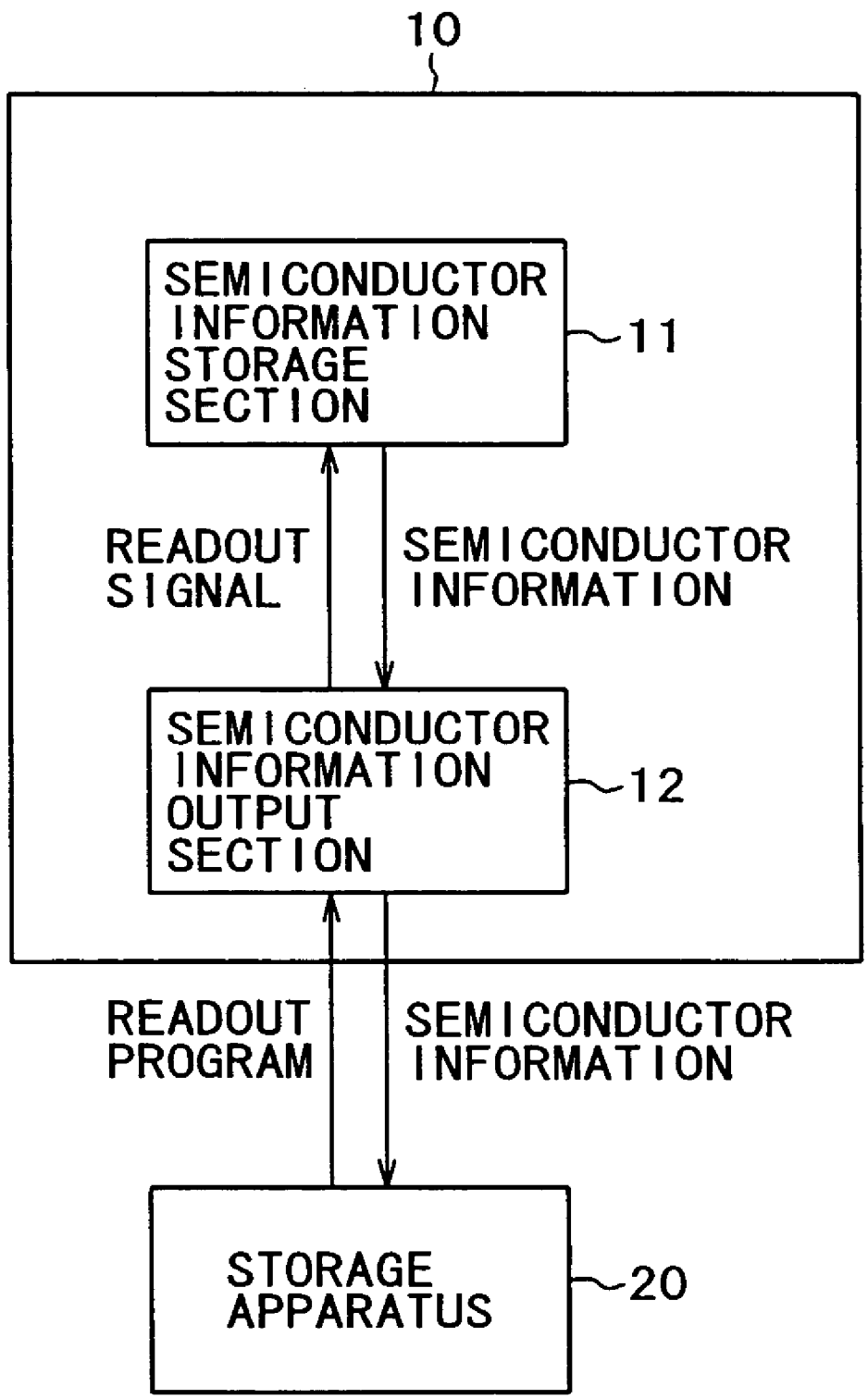
FIG. 1 is a schematic diagram showing the outline of the present invention.

FIG. 1 is a schematic diagram showing the outline of the present invention. A semiconductor integrated circuit apparatus 10 according to the present invention has a semiconductor information storage section 11 for storing semiconductor information and a semiconductor information output section 12 for outputting the semiconductor information to the outside in response to a request from the outside.

The semiconductor information storage section 11 has semiconductor information unique to the semiconductor integrated circuit apparatus 10 previously registered and held therein. The semiconductor information registered is individual information possessed by the semiconductor integrated circuit apparatus or an identification code assigned to allow identification of the individual. The individual information includes, for example, a lot number, a wafer number, a position on the wafer, a manufacture time, and a manufacture factory.

The semiconductor information output section 12 is connected to the outside through a signal line and reads out the semiconductor information held in the semiconductor information storage section 11 in response to a signal supplied thereto from the outside to output the read-out semiconductor information to the outside. For example, when a storage apparatus 20 is provided externally and connected to the semiconductor information output section 12, the section 12 writes the read-out semiconductor information into a predetermined region of the storage apparatus 20. Alternatively, the external storage apparatus 20 may store a program for performing readout processing of semiconductor information such that the semiconductor information output section 12 reads out and executes the program to perform the readout processing of semiconductor information described above.

The storage apparatus 20 is provided externally to the semiconductor integrated circuit apparatus 10 and connected to the semiconductor information output section 12 through the signal line. The storage apparatus 20 is mounted on a circuit board on which the semiconductor integrated circuit apparatus 10 is mounted or mounted on an external device which can be connected to the circuit board.

Next, description is made for the operation of the semiconductor integrated circuit apparatus 10 configured as above.

The semiconductor information storage section 11 holds therein the semiconductor information unique to the semiconductor integrated circuit apparatus 10 which can identify the semiconductor integrated circuit apparatus 10. The semiconductor information output section 12 reads out the semiconductor information held in the semiconductor information storage section 11 in response to a signal supplied from the outside through the signal line and outputs the read information to the outside through the signal line. For example, when the semiconductor integrated circuit apparatus 12 is connected to the external storage apparatus 20 through the signal line, the read-out semiconductor information is written into the predetermined region of the storage apparatus 20. When the external storage apparatus 20 has a program for performing readout processing stored therein, the program is read to perform the readout processing according to the program.

As described above, the semiconductor integrated circuit apparatus 10 of the present invention allows the semiconductor information stored in the apparatus to be read out from the outside. The semiconductor information is unique to the semiconductor integrated circuit apparatus 10 and can be relied on to identify the individual to know the features (the lot number, the position on the wafer, the manufacture time and the like) of the semiconductor integrated circuit apparatus 10.

As described above, according to the present invention, when a malfunction occurs in a semiconductor integrated circuit apparatus, information for identifying the semiconductor integrated circuit apparatus can be easily read out without requiring a number of man-hours and special techniques for taking out the semiconductor integrated circuit apparatus as conventional.

Next, description is made for preferred embodiments to which the aforementioned concepts of the present invention are applied.

Figure 2:
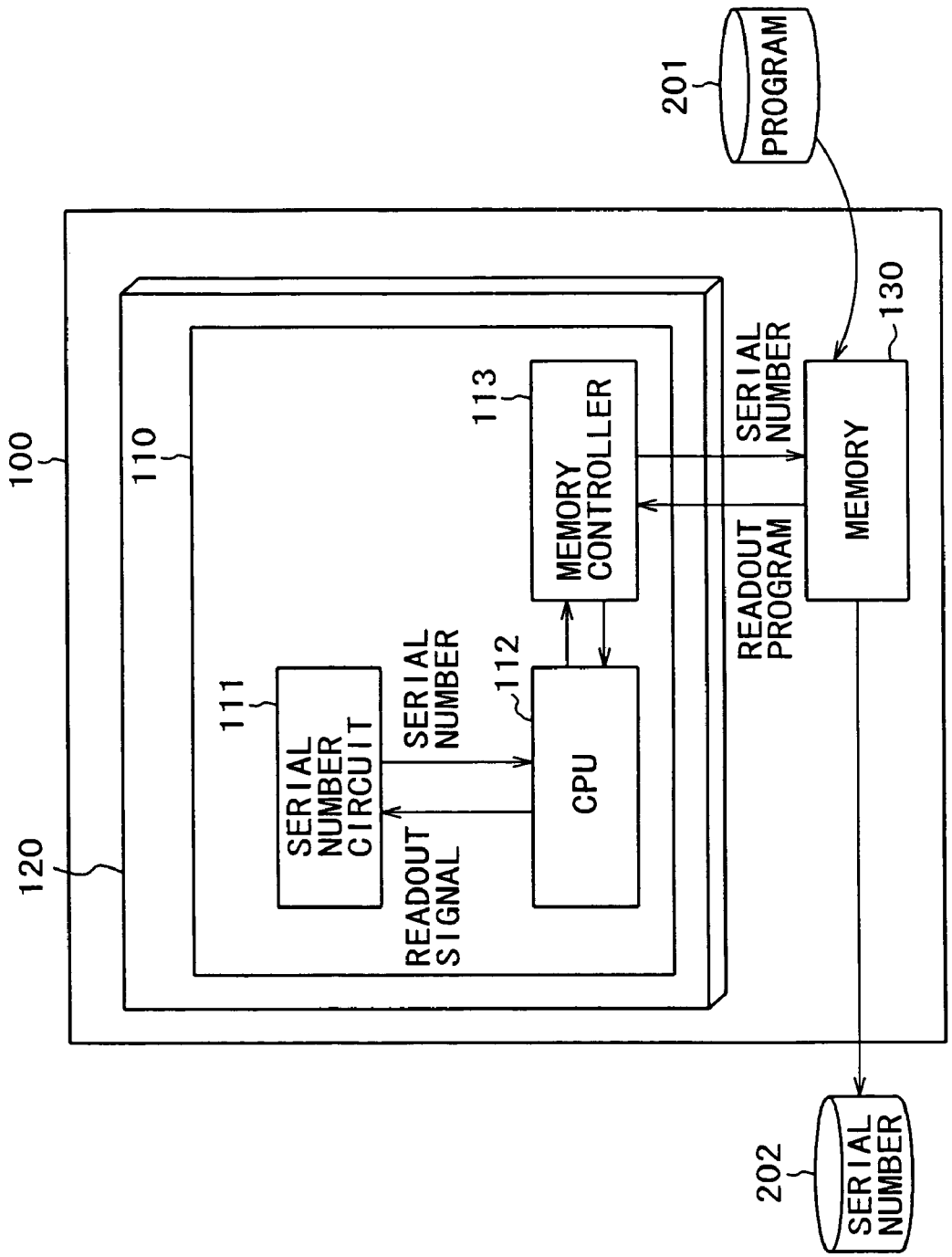
FIG. 2 is a schematic diagram showing a semiconductor integrated circuit apparatus serving as a first embodiment and a circuit board on which the semiconductor integrated circuit apparatus is mounted.

FIG. 2 is a schematic diagram showing a semiconductor integrated circuit apparatus serving as a first embodiment of the present invention and a circuit board on which the semiconductor integrated circuit apparatus is mounted.

The semiconductor integrated circuit apparatus (hereinafter referred to as a semiconductor chip) 110 according to the present invention is mounted on a printed circuit board 100 as a semiconductor package 120 sealed by a resin or the like. A memory 130 capable of reading from and writing to the outside is also mounted on the printed circuit board 100. The memory 130 is connected as required to a recording medium 201 for storing a program and to a serial number storage apparatus 202 for saving and managing serial number information.

The semiconductor chip 110 has a serial number circuit 111 for storing semiconductor information, a CPU 112 for controlling serial number readout, and a memory controller 113 for connection to the external memory 130.

The serial number circuit 111 is a semiconductor information storage section for storing semiconductor information unique to the semiconductor chip 110. The serial number is a number assigned to each semiconductor chip in association with the lot number, the position on the wafer, the manufacture number or the like, and serves as an identification code for allowing identification of the semiconductor chip 110. The serial number allows the individual to be identified. The serial number circuit 111 is formed of, for example, a plurality of fuses for outputting an electric signal corresponding to a value of 1 or 0, and a predetermined serial number can be set by blowing an arbitrary fuse at the time of product shipment or the like. Alternatively, the serial number circuit 111 may be formed of a memory device such as an EPROM. The serial number circuit 111 outputs an electric signal corresponding to the serial number in response to a selection signal from the CPU 112 connected thereto.

The CPU 112 and the memory controller 113 constitute the semiconductor information output section. The CPU 120 is a control section for performing readout processing. As the CPU 120, a processor dedicated to the readout processing may be used, or a processor for controlling the overall semiconductor chip 110 may be used. The memory controller 113 is a connection control section for connection to the CPU 112 and the memory 130 to control readout of data from the memory 130 and write of data into the memory 130 by the CPU 112.

The memory 130 stores a readout program for causing the semiconductor chip 110 to perform serial number readout processing, and has a predetermined region for storing the read serial number. The read program is loaded as required from the recording medium 201 which stores the program. The taken serial number is output to the serial number storage apparatus 202 for saving and managing the serial number.

Next, description is made for the operation of the semiconductor chip 110 and the printed circuit board 100 on which the semiconductor chip 110 is mounted.

For example, when a malfunction is found in the semiconductor chip 110, a program is created for performing the processing of reading out the serial number from the serial number circuit 111 for output to the outside. The creation of the program may be performed on an electric device on which the semiconductor chip 110 is mounted or may be performed by a separately prepared personal computer or the like. The program separately created by the personal computer or the like and saved in the predetermined recording medium 201 is transferred to the memory 130 on the printed circuit board 100 from which the semiconductor chip 110 can read out the program. In this manner, the program is written into the memory 130 to enter a state in which the program can be executed, thereby the readout processing is started.

The CPU 112 reads the readout program held in the memory 130 through the memory controller 113 to perform processing in accordance with the program. Specifically, the CPU 112 reads out the serial number held in the serial number circuit 111 through a signal connected to the serial number circuit 111 and writes the read serial number into the memory 130 through the memory controller 113. In this manner, the serial number unique to the semiconductor chip 110 is taken out to the memory 130.

The serial number taken out to the memory 130 can be displayed and seen on a display or the like of the electric device on which the printed circuit board 100 is mounted, or can be transferred to the serial number storage apparatus 202 for holding and managing the serial number to be seen on a separately prepared personal computer. The serial number thus provided has been assigned in association with the manufacture lot number, the position on the wafer, and the manufacture time of the semiconductor chip 110 and allows identification of the features of the semiconductor chip 110.

As described above, in the first embodiment, the processing of outputting the internal serial number to the outside can be performed through the memory 130 provided on the printed circuit board 100 on which the semiconductor chip 110 is mounted to take out the serial number. In this manner, the semiconductor chip 110 can be identified with the semiconductor chip 110 mounted on the printed circuit board 100 to omit a complicated process for readout to reduce the time required for identification.

Next, another embodiment is described.

Figure 3:
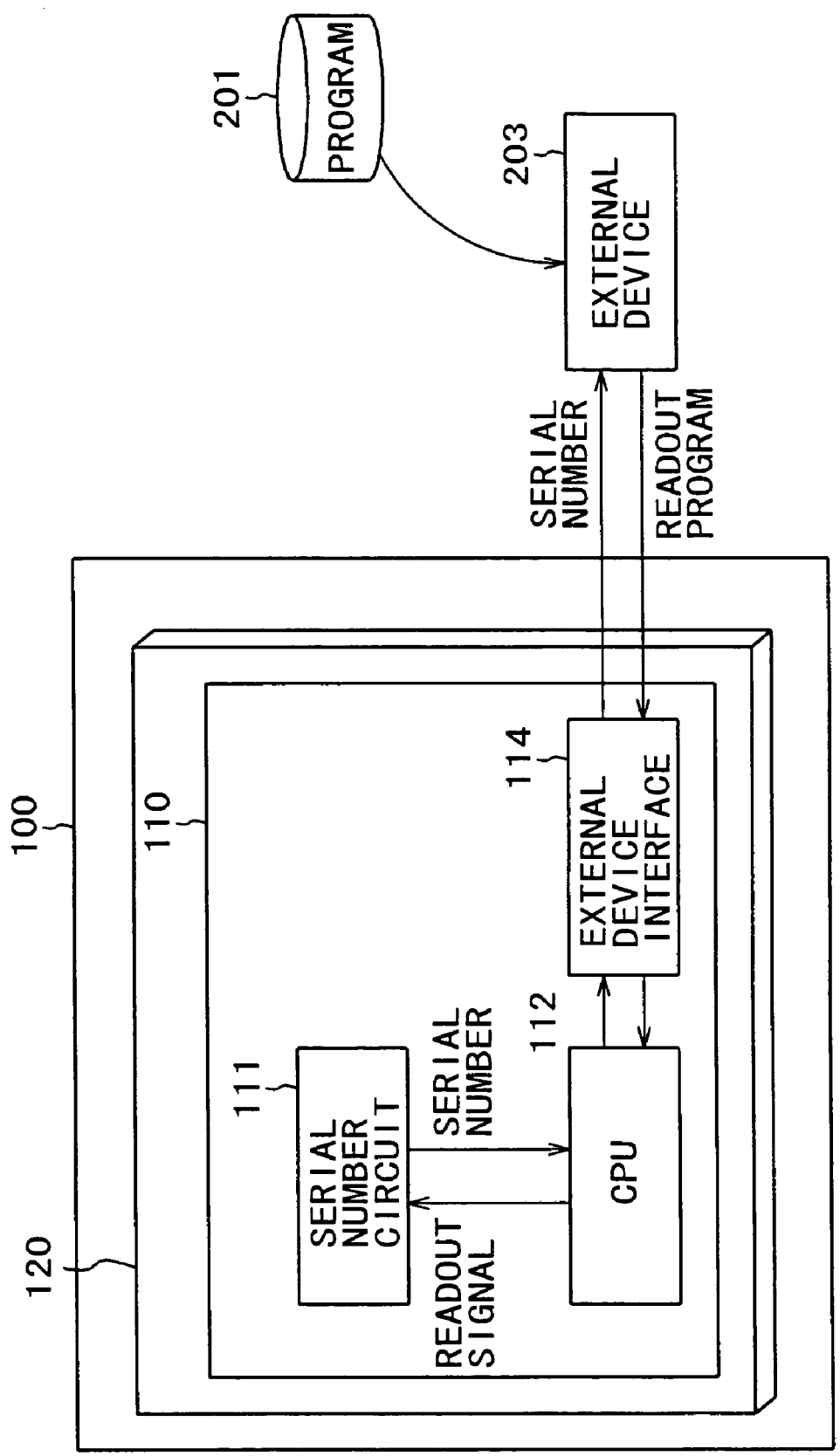
FIG. 3 is a schematic diagram showing a semiconductor integrated circuit apparatus serving as a second embodiment and a circuit board on which the semiconductor integrated circuit apparatus is mounted.

FIG. 3 is a schematic diagram showing a semiconductor integrated circuit apparatus serving as a second embodiment of the present invention and a circuit board on which the semiconductor integrated circuit apparatus is mounted. Components identical to those shown in FIG. 2 are designated with the same reference numerals, and description thereof is omitted.

A semiconductor chip 110 according to the present invention has a serial number circuit 111 for storing semiconductor information, a CPU 112 for controlling serial number readout, and an external device interface 114 for connection to an external device 203.

The external device 203 is connected to an electric device on which a printed circuit board 100 is mounted, capable of data exchange, and has a predetermined storage region. As such an external device, a memory stick or a compact disc is used, for example. The external device 203 has a readout program stored therein for causing the semiconductor chip 110 to perform serial number readout processing and has the predetermined region for storing the read serial number. The read program is loaded as required from a recording medium 201 for storing the program.

The external device interface 114 is a connection control section for connecting the CPU 112 to the external device 203 and performs readout of data from the external device 203 and processes a request for write of data into the external device 203 by the CPU 112.

Next, description is made for the operation of the semiconductor chip 110 configured as above and the printed circuit board 100 on which the semiconductor chip 110 is mounted.

For example, when a malfunction is found in the semiconductor chip 110, a program is created for performing the processing of reading out the serial number from the serial number circuit 111 for output to the outside. The created program is written into the external device 203 to enter a state in which the program can be executed to start readout processing.

The CPU 112 reads the readout program held in the external device 203 through the external device interface 114 to perform processing in accordance with the program. Specifically, the CPU 112 reads out the serial number held in the serial number circuit 111 and writes the read serial number into the predetermined region of the external device 203 through the external device interface 114. In this manner, the serial number unique to the semiconductor chip 110 is taken out to the external device 203.

The serial number taken out to the external device 203 can be seen on a separately prepared personal computer or the like. The serial number thus provided has been assigned in association with the manufacture lot number, the position on the wafer, and the manufacture time of the semiconductor chip 110 and allows identification of the features of the semiconductor chip 110.

As described above, when the semiconductor chip serving as the second embodiment is mounted on the electric device which can be connected to the external device having the recording medium, the readout program can be stored in the external device to perform the serial number readout processing. The read serial number can be written into and taken out to the external device. With this configuration, the semiconductor chip can be identified without performing a complicated process for taking out the semiconductor chip.

Next, description is made for the readout processing of semiconductor information by using the semiconductor integrated circuit apparatus of the present invention.

Figure 4:
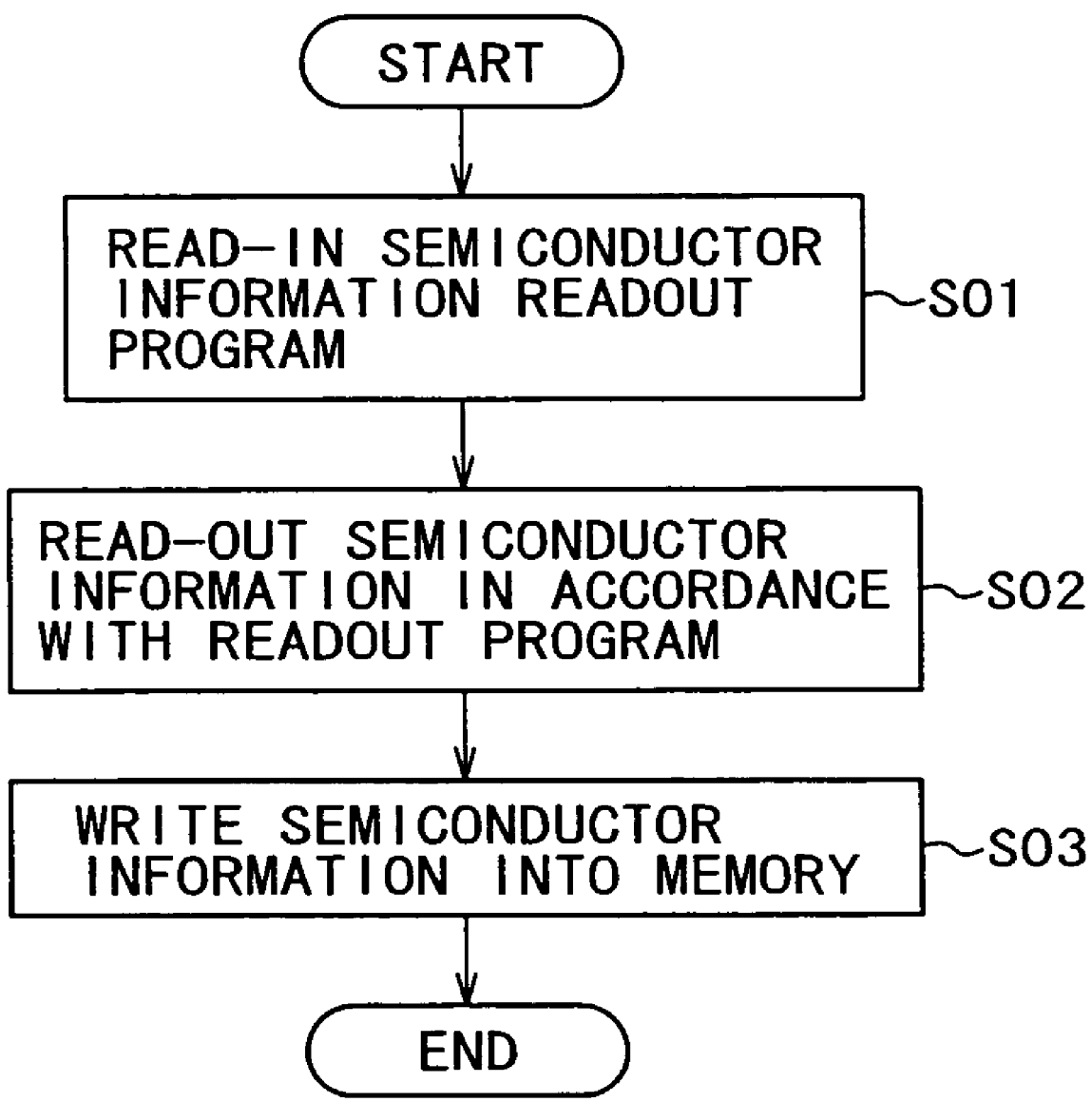
FIG. 4 is a flow chart showing a procedure of readout processing of semiconductor information serving as an embodiment of the present invention.
Figure 5:
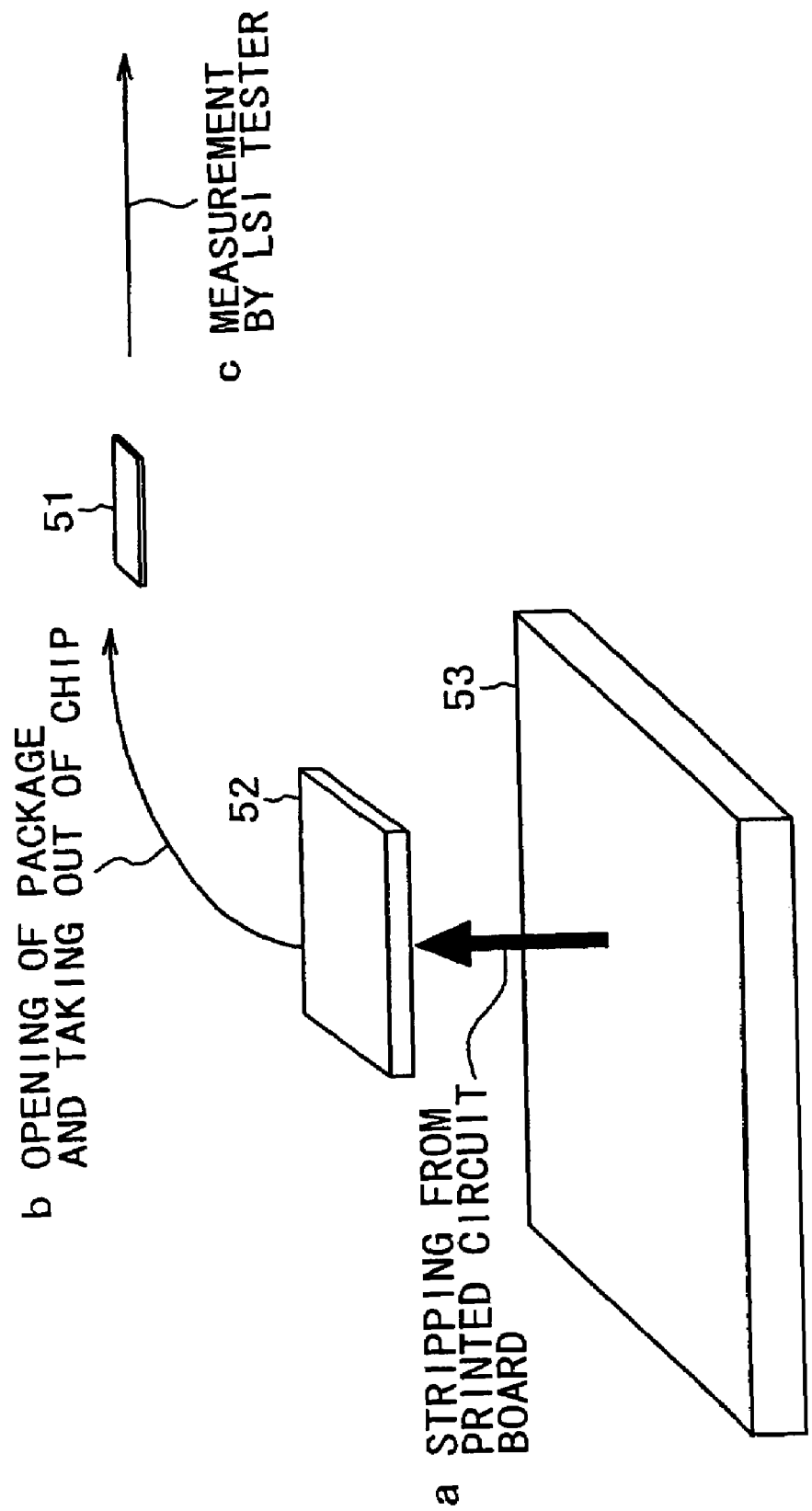
FIG. 5 shows a conventional procedure for reading out internal information of a semiconductor integrated circuit apparatus.

FIG. 4 is a flow chart for showing a readout processing procedure of semiconductor information serving as an embodiment of the present invention. The processing is started by creating the readout processing program and loading it into a recording medium from which the CPU of the semiconductor chip can read the program.

(Step S01) The semiconductor information readout program stored in the readable recording medium is read. For example, the program stored in a memory provided on a circuit board on which the semiconductor chip is mounted, or in a memory of an accessible external device is read through a memory controller or an external interface.

(Step S02) The semiconductor information is read from the semiconductor information storage circuit in accordance with the read program.

(Step S03) The read semiconductor information is written into a predetermined region of the memory external to the semiconductor chip designated by the program through the memory controller or the external interface.

In this manner, the semiconductor information readout program is created and stored in the memory readable from the semiconductor integrated circuit apparatus to allow the semiconductor integrated circuit apparatus to read the semiconductor information in accordance with the program and store the information into the designated external memory. With this configuration, the semiconductor chip can be identified without performing a complicated process for taking out the semiconductor chip.

As described above, in the semiconductor integrated circuit apparatus of the present invention, the semiconductor information unique to the apparatus is previously stored and read out in response to a signal supplied from the outside for output to the outside. Since the semiconductor information can be read out from the outside in this manner, the product can be easily identified. As a result, the process for taking out the semiconductor integrated circuit apparatus can be omitted, the semiconductor integrated circuit apparatus can be identified easily and the time required for identification can be reduced.

In addition, in the circuit board of the present invention, the semiconductor information stored in the semiconductor integrated circuit apparatus mounted thereon can be taken out to the storage section provided on the circuit board. In this manner, the semiconductor information can be taken out while the semiconductor integrated circuit apparatuses are still being mounted on the board to identify the product.

Furthermore, in the information readout method of the present invention, the program for performing the readout processing of the semiconductor information of the mounted semiconductor integrated circuit apparatus is written, and the semiconductor integrated circuit apparatus outputs the semiconductor information stored therein to the outside in accordance with the program. In this manner, the semiconductor information can be taken out while the semiconductor integrated circuit apparatuses are still being mounted on the board to identify the product. In addition, the program can be executed to perform the readout processing of the semiconductor information to easily select and take the information required at some point in time or manipulate the information.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor integrated circuit apparatus mounted on a predetermined circuit board, the apparatus comprising:
   semiconductor information storage means for storing semiconductor information unique to the semiconductor integrated circuit apparatus; and
   semiconductor information output means connected to the semiconductor information storage means for (1) reading out the semiconductor information from the semiconductor information storage means in response to a signal supplied by an external device that is external to, connectable to, and removable from the semiconductor integrated circuit apparatus, the external device storing an executable program and having a predetermined non-volatile storage region, and (2) writing the read-out semiconductor information to the predetermined storage region of the external device,
   wherein the semiconductor information output means includes
      first control means, which is configured to be connected to the external device storing the executable program, for controlling a read-out operation of the program stored in the external device, the program being used for executing the read-out operation of the semiconductor information, and
   second control means for controlling the read-out operation and external outputting operation of the semiconductor information by executing the read-out program read by the first control means.

2. The semiconductor integrated circuit apparatus according to claim 1, wherein
   the semiconductor information storage means (1) stores an identification code as the semiconductor information, the identification code being assigned to allow identification of the semiconductor integrated circuit apparatus, and (2) outputs an electric signal according to the identification code in response to an input of a signal.

3. The semiconductor integrated circuit apparatus of claim 1, wherein the external device is one of a flash memory device and a compact disc.

4. A circuit board on which a semiconductor integrated circuit apparatus is mounted, the circuit board comprising:
   semiconductor information storage means for storing semiconductor information unique to the semiconductor information circuit apparatus; and
   semiconductor information output means, which is configured to be connected to the semiconductor information storage means, for (1) reading out the semiconductor information from the semiconductor information storage means in response to a signal supplied by an external device that is external to, connectable to, and removal from the semiconductor integrated circuit apparatus, the external device storing an executable program and having a predetermined non-volatile storage region, and (2) writing the read-out semiconductor information to the predetermined storage region of the external device,
   wherein the external device stores the executable program being used for executing the read-out operation of the semiconductor information, and
   wherein the semiconductor information output means controls (1) the read-out operation of the semiconductor information by executing the program read out from the external device, and (2) the write-in operation of semiconductor information to the external device.

5. An information readout method of reading out semiconductor information of a semiconductor integrated circuit apparatus mounted on a predetermined circuit board, the method comprising:
   writing an executable program, which is for reading out semiconductor information unique to the semiconductor integrated circuit apparatus and stored in the semiconductor integrated circuit apparatus, into a predetermined external device that is external to, connectable to, and removable from the semiconductor integrated circuit apparatus, the external device storing an executable program and having a predetermined non-volatile storage region;
   reading the executable program written into the external device and reading out the semiconductor information by executing the read program; and
   writing the read-out semiconductor information into the predetermined region of the external device.

6. The semiconductor integrated circuit apparatus of claim 5, wherein the semiconductor information includes at least one of a wafer number, information of a position on a wafer, and a manufacture time of the semiconductor integrated circuit.

7. A semiconductor integrated circuit apparatus mounted on a predetermined circuit board, the apparatus comprising:
   a semiconductor information storage section configured to store semiconductor information unique to the semiconductor integrated circuit apparatus, and
   a semiconductor information output section connected to the semiconductor information storage section and configured (1) to read out the semiconductor information from the semiconductor information storage section in response to a signal supplied by an external device that is external to, connectable to, and removable from the semiconductor circuit apparatus, the external device storing an executable program and having a predetermined non-volatile storage region, and (2) to output the read-out semiconductor information to the predetermined storage region of the external device,
   wherein the semiconductor information output section includes
   first control means, which is configured to be connected to the external device storing the executable program, for controlling a read-out operation of the program stored in the external device, the program being used for executing the read-out operation of the semiconductor information, and
   second control means for controlling the read-out operation and external outputting operation of the semiconductor information by executing the read-out program read by the first control means.

* * * * *

UNITED STATES PATENT AND TRADEMARK OFFICE
CERTIFICATE OF CORRECTION

| | | |
|---|---|---|
| PATENT NO. | : 7,346,712 B2 | Page 1 of 1 |
| APPLICATION NO. | : 10/735680 | |
| DATED | : March 18, 2008 | |
| INVENTOR(S) | : Takahito Nakano et al. | |

It is certified that error appears in the above-identified patent and that said Letters Patent is hereby corrected as shown below:

Column 10, line 5, insert --the-- before "semiconductor."

Signed and Sealed this

Twenty-first Day of October, 2008

JON W. DUDAS
*Director of the United States Patent and Trademark Office*